(12) United States Patent
Kitahara

(10) Patent No.: US 6,943,590 B2
(45) Date of Patent: Sep. 13, 2005

(54) CLOCK MONITORING APPARATUS

(75) Inventor: Takashi Kitahara, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/699,777

(22) Filed: Nov. 4, 2003

(65) Prior Publication Data

US 2004/0090245 A1 May 13, 2004

Related U.S. Application Data

(62) Division of application No. 10/242,415, filed on Sep. 13, 2002, now Pat. No. 6,670,839.

(30) Foreign Application Priority Data

Sep. 18, 2001 (JP) ........................ 2001/283579

(51) Int. Cl.[7] .............................................. G01R 19/00
(52) U.S. Cl. ........................ 327/18; 327/292; 713/500; 713/502; 714/2; 714/34; 714/744
(58) Field of Search .................... 327/292, 18; 714/797, 714/814, 817, 2, 34, 744; 713/500–503

(56) References Cited

U.S. PATENT DOCUMENTS

| | | | | |
|---|---|---|---|---|
| 4,653,054 A | * | 3/1987 | Liu et al. ..................... | 714/814 |
| 5,642,069 A | | 6/1997 | Waite .......................... | 327/292 |
| 5,969,558 A | | 10/1999 | Abe ............................ | 327/292 |
| 6,343,334 B1 | * | 1/2002 | Uemura et al. ................ | 710/8 |
| 6,670,839 B2 | * | 12/2003 | Kitahara ...................... | 327/292 |

FOREIGN PATENT DOCUMENTS

JP            7-006155         1/1995

* cited by examiner

*Primary Examiner*—Kenneth B. Wells
(74) *Attorney, Agent, or Firm*—McGinn & Gibb, PLLC

(57) ABSTRACT

A clock monitoring apparatus according to the invention including a main clock monitoring portion including a first counter for counting a main clock, issuing a normal operation confirming flag indicating that a normal operation is being carried out when the first counter is overflowed or reaches a previously determined set value, monitoring the normal operation confirming flag by a sub clock, issuing a first main clock stop flag having an output in correspondence with H (high level)/L (low level) of the normal operation confirming flag and a main clock initializing signal for initializing the main clock when the main clock is determined to stop and resetting the first main clock stop flag when the main clock is recovered by receiving the main clock initializing signal, and a sub clock switching control portion including a second counter for counting a signal output produced by calculating a logical sum of the sub clock and the first main clock stop flag at fall of the sub clock at a time point of generating the first main clock stop flag, switching to a sub clock operation by issuing a sub clock switching signal when the second counter output is overflowed or reaches a previously determined set value and resetting the second counter output when the main clock is recovered and a second main clock stop flag produced by inverting the first main clock stop flag and delaying the sub clock by a predetermined period by a main clock monitoring portion, is reset.

20 Claims, 12 Drawing Sheets

US 6,943,590 B2

CLOCK MONITORING APPARATUS

The present Application is a Divisional Application of U.S. patent application Ser. No. 10/242,415, filed on Sep. 13, 2002 now U.S. Pat. No. 6,670,839.

BACKGROUND OF THE INVENTION

1. Field of the Invention

The present invention relates to a clock monitoring apparatus, particularly to a clock monitoring apparatus controlling a main clock and a sub clock to substitute for each other in failure to thereby realize a stable operation of a microcomputer even when the main clock is stopped.

2. Description of the Prior Art

Although a monitoring circuit of a clock is used for realizing a stable operation of a microcomputer, when a main clock is stopped, CPU is also stopped and therefore, it is requested for the monitoring circuit to monitor the clock by a signal stably operating even when the main clock is stopped and, when the main clock is stopped, to swiftly deal therewith.

In order to meet the request, it has been proposed that when the main clock is stopped, the stop of the clock is dealt with by switching the main clock to a sub clock as disclosed in, for example, a prior application (Single chip microcomputer: Japanese Patent Laid-Open No. 7-6155) and a method disclosed in the prior art literature is shown in FIG. 12.

In a circuit shown in FIG. 12, it is assumed that a main clock 1102 selected by a system clock switching circuit 1009 is oscillated normally. A timer 1004 is for counting a sub clock 1101 and during a time period in which the main clock 1102 is normally oscillated, the sub clock 1101 is reset periodically before overflowing by a timer reset signal 1105 outputted from an internal bus 1201 by receiving execution of instruction in CPU. Therefore, the timer 1004 is not overflowed and therefore, a timer carry signal 1106 is not issued.

When the main clock 1102 is stopped, since the timer reset signal 1105 is not issued, the timer is overflowed, the timer carry signal 1106 is issued and a clock switch flag 1006 is changed. Thereby, a clock switch signal 1108 is issued and the main clock 1102 is switched to the sub clock 1101.

As described above, according to the prior art, when the main clock is stopped for some cause, the stop is dealt with by switching the main clock to the sub clock and there is not provided a constitution of spontaneously issuing a reset signal and initializing the clock as in the present invention. Therefore, when the main clock is stopped, the main clock is switched to the sub clock which continues operating in a state as it is and there is a drawback that in order to recover an original state, a control or the like by a software is separately needed. Further, since the normally-counted signal is the sub clock, much time is needed until the counter overflows, as a result, there also poses a problem of producing time lag until the stop is dealt with (switch to sub clock). When the sub clock is stopped, the abnormal stop cannot be detected.

BRIEF SUMMARY OF THE INVENTION

Objects of the Invention

It is an object of the present invention to provide a clock monitoring apparatus capable of automatically initializing a main clock when the main clock is stopped and continuing operation in a state before abnormality when the main clock is recovered, continuing operation by switching the main clock to a sub clock when the main clock cannot be recovered and issuing a flag when the sub clock is also stopped to thereby achieve stable operation of a microcomputer even when the main clock is stopped.

SUMMARY OF THE INVENTION

According to an aspect of the invention, there is provided a clock monitoring apparatus comprising a main clock monitoring portion including a first counter for counting a main clock, issuing a normal operation confirming flag indicating that a normal operation is being carried out when the first counter is overflowed or reaches a previously determined set value, monitoring the normal operation confirming flag by a sub clock, issuing a first main clock stop flag having an output in correspondence with H (high level)/L (low level) of the normal operation confirming flag and a main clock initializing signal for initializing the main clock when the main clock is determined to stop and resetting the first main clock stop flag when the main clock is recovered by receiving the main clock initializing signal, and a sub clock switching control portion including a second counter for counting a signal output produced by calculating a logical sum of the sub clock and the first main clock stop flag at fall of the sub clock at a time point of generating the first main clock stop flag, switching to a sub clock operation by issuing a sub clock switching signal when a second counter output is overflowed or reaches a previously determined set value and resetting the second counter output when the main clock is recovered and a second main clock stop flag produced by inverting the first main clock stop flag and delaying the sub clock by a predetermined period by a main clock monitoring portion, is reset.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
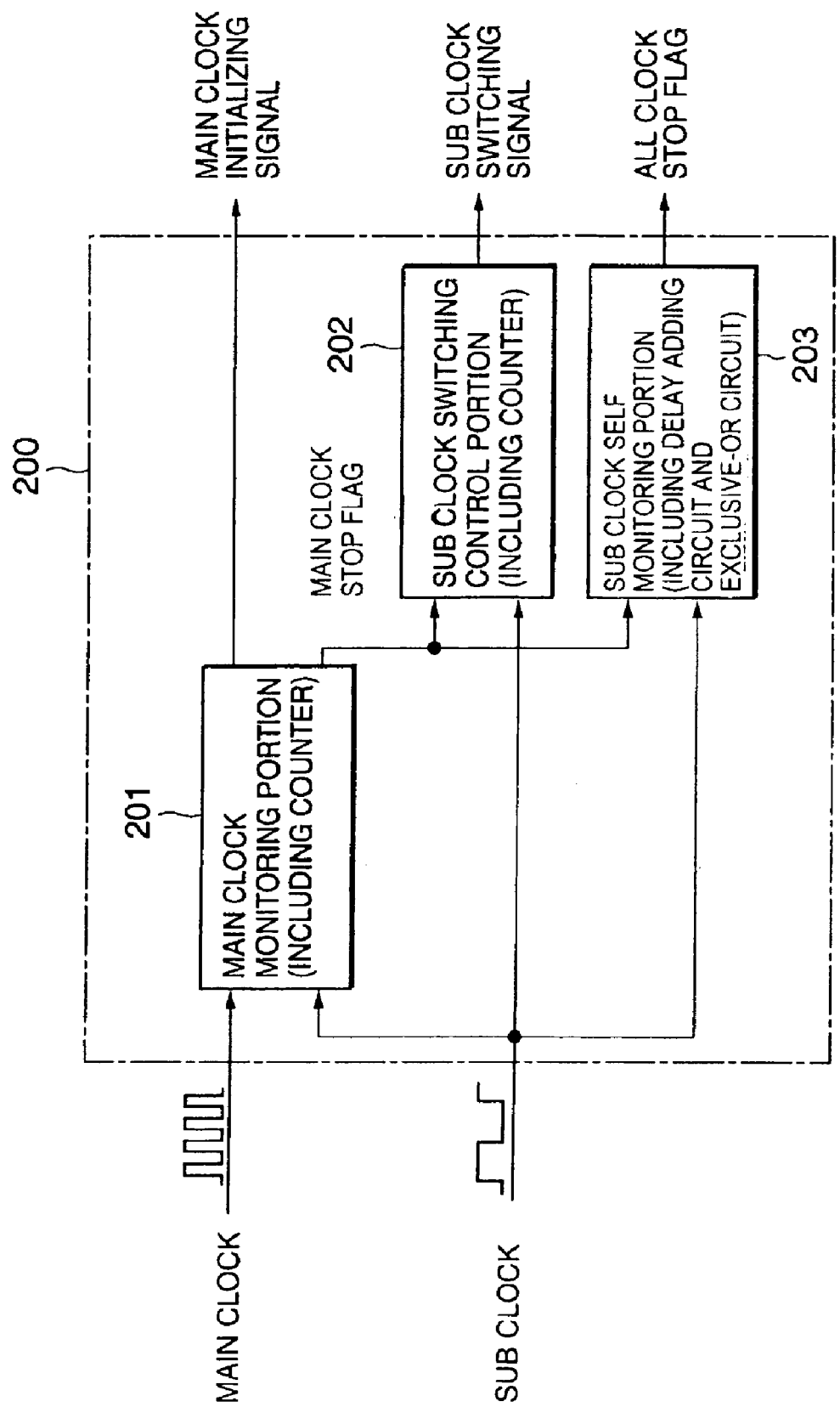
FIG. 1 is a block diagram showing a first embodiment of a clock monitoring apparatus according to the invention.
Figure 2:
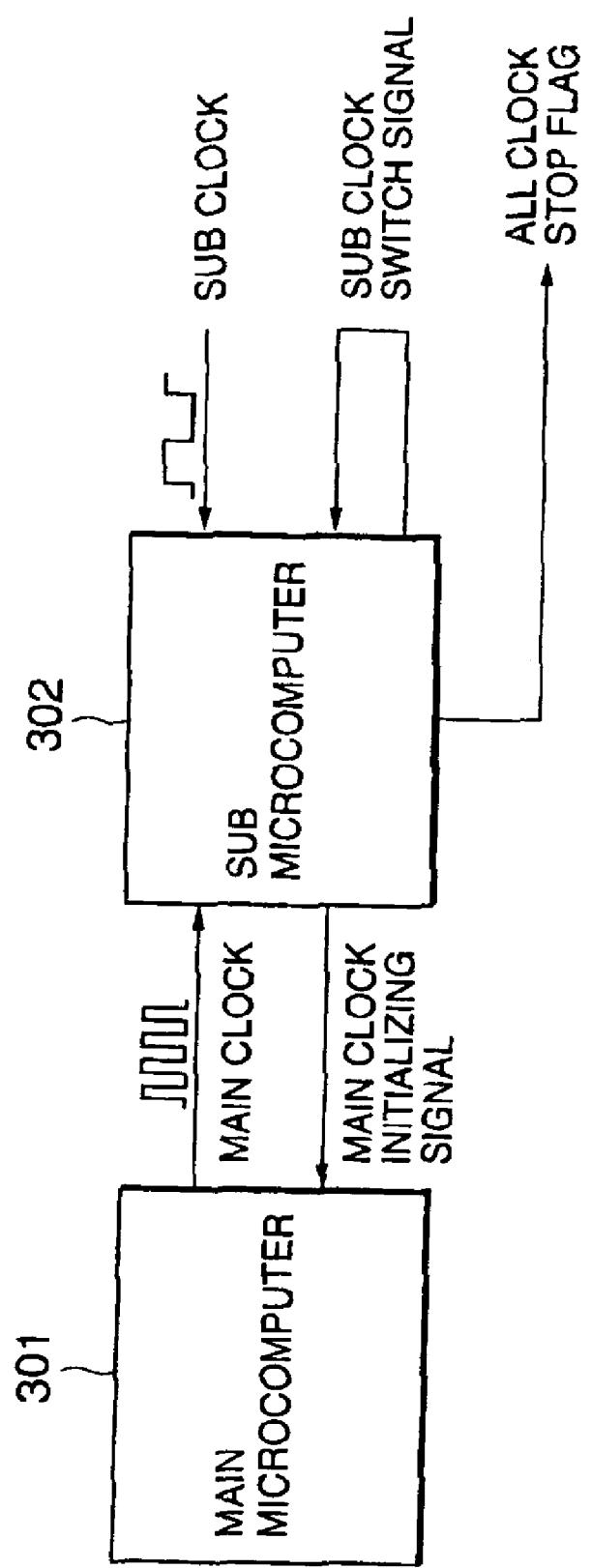
FIG. 2 is a diagram showing a clock monitoring system constituted by a main microcomputer and a sub microcomputer including a clock monitoring apparatus according to the invention.

An explanation will be given of a first embodiment of a clock monitoring apparatus according to the invention in reference to the drawings. The clock monitoring apparatus according to the invention is integrated into a clock monitoring system shown in FIG. 2. The system comprises a main microcomputer 301 and a sub microcomputer 302 and the clock monitoring apparatus is included to a side of the sub microcomputer 302. FIG. 1 is a block diagram showing a constitution of the clock monitoring apparatus and FIG. 3 is a block diagram showing a further detailed constitution of the clock monitoring apparatus.

In FIG. 1, a clock monitoring apparatus 200 includes a main clock monitoring portion 201 including a counter, a sub clock switching control portion 202 including a counter, and a sub clock self monitoring portion 203 including a delay adding circuit and an exclusive-OR circuit.

Figure 3:
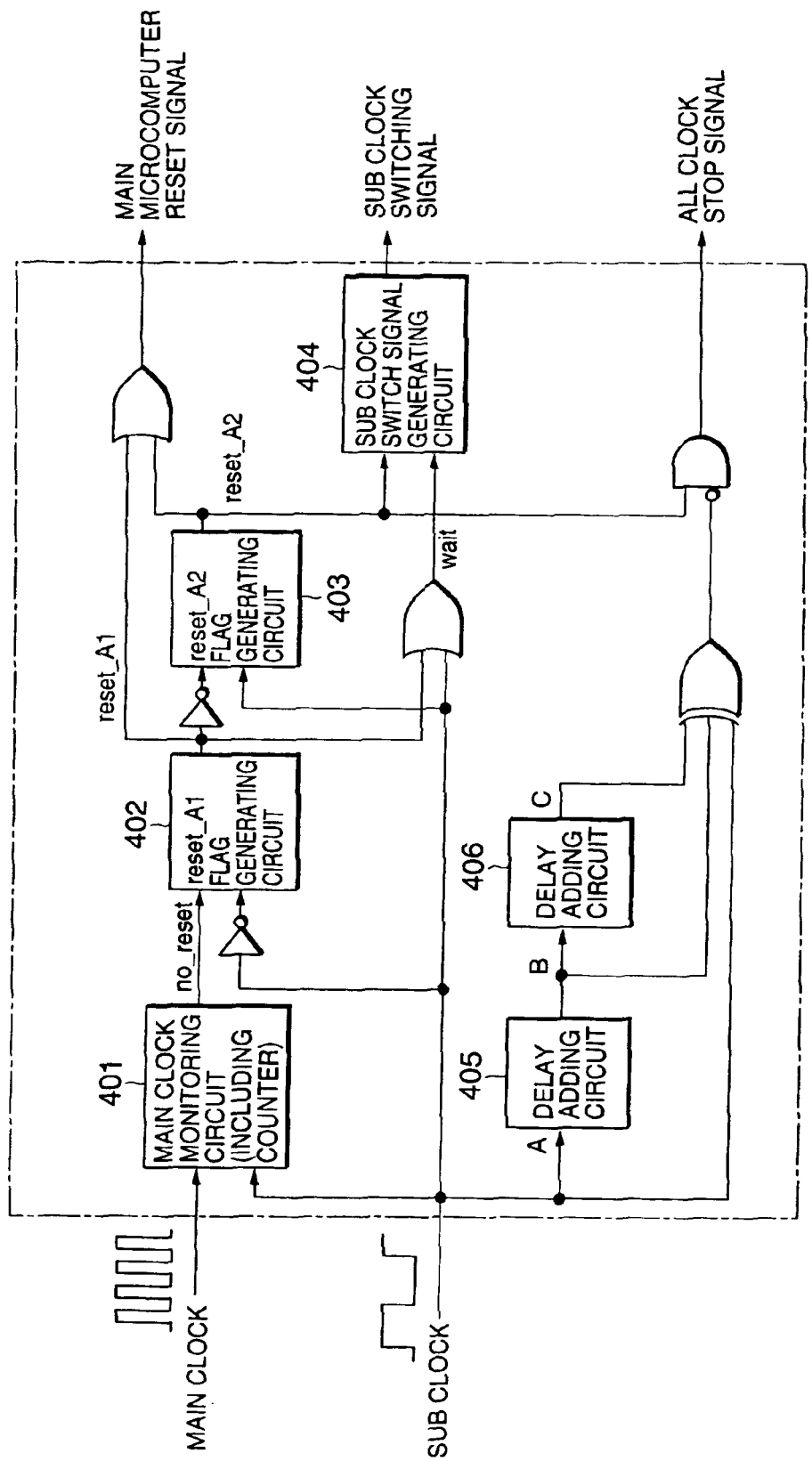
FIG. 3 is a block diagram showing a detailed constitution of the clock monitoring apparatus of FIG. 1.

In details, as shown by FIG. 3, the clock monitoring apparatus 200 is constituted by a main clock monitoring circuit 401, a reset_A1 flag generating circuit 402, a reset_A2 flag generating circuit 403, a sub clock switch signal generating counter 404 and delay adding circuits 405 and 406. Here, the main clock monitoring portion 201 is constituted by the main clock monitoring circuit 401, the reset_A1 flag generating circuit 402, the reset_A2 flag generating circuit 403 and a logical sum circuit (OR gate) and the sub clock switching control portion 202 is constituted by a logical sum circuit (OR gate) and the sub clock switch signal generating counter 404.

The main clock monitoring circuit 401 counts a main clock by the included counter and issues a normal operation confirming flag no_reset constituting "H" ("1", that is, signifying high level) indicating that normal operation is being carried out when the counter is equal to a predetermined set value, or overflowed. The flag no_reset is monitored at fall of a sub clock. The reset_A1 flag generating circuit 402 issues a flag reset_A1 constituting "H" when the no_reset is "H" and "L" when the no_reset is "L" ("0", that is, signifying low level). The reset_A2 flag generating circuit 403 issues a main clock stop flag reset_A2 inverting the flag reset_A1 and delaying by a half period of the sub clock and issues a main clock initializing (main microcomputer resetting) signal. However, the reset_A2 flag generating circuit 403 issues the signals only when the main clock is determined to stop. When the main clock is recovered by receiving the main clock initializing signal, the reset_A2 flag generating circuit 403 continues operating as it is by resetting the main clock stop flag reset_A2.

Next, an explanation will be given of operation of the clock monitoring apparatus having the above-described constitution in reference to FIG. 4 through FIG. 8. First, an explanation will be given of a case of normal operation.

The main clock is counted and there is generated the signal no_reset constituting "H" when the counter is equal to the set value or overflowed by the counter. At rise of the sub clock, no_reset=0 (step S101 of FIG. 8) and simultaneously, the counter is reset and counting of the main clock is started (notation 51 in FIG. 4).

Figure 4:
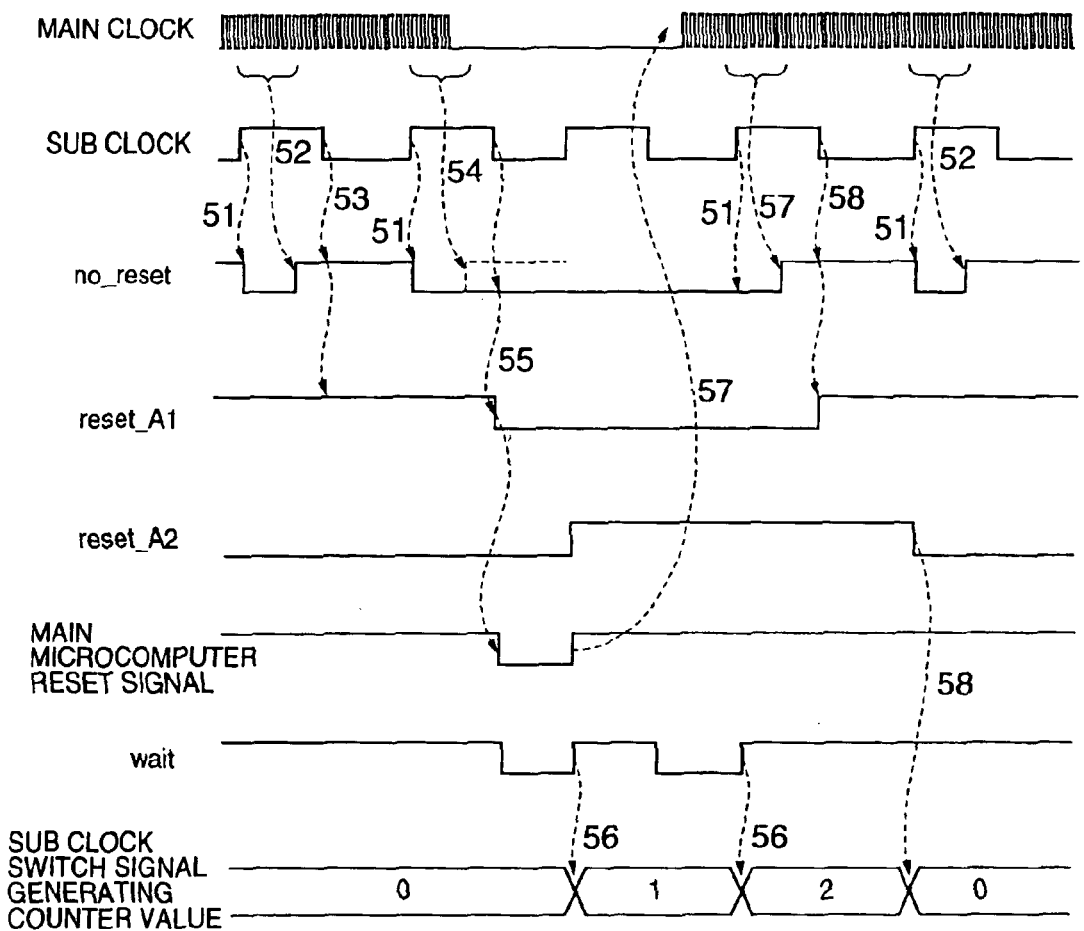
FIG. 4 is a timing chart showing a waveform of operation in the case in which a main clock is stopped when a main clock normal operation confirming flag is 0 and thereafter recovered.
Figure 5:
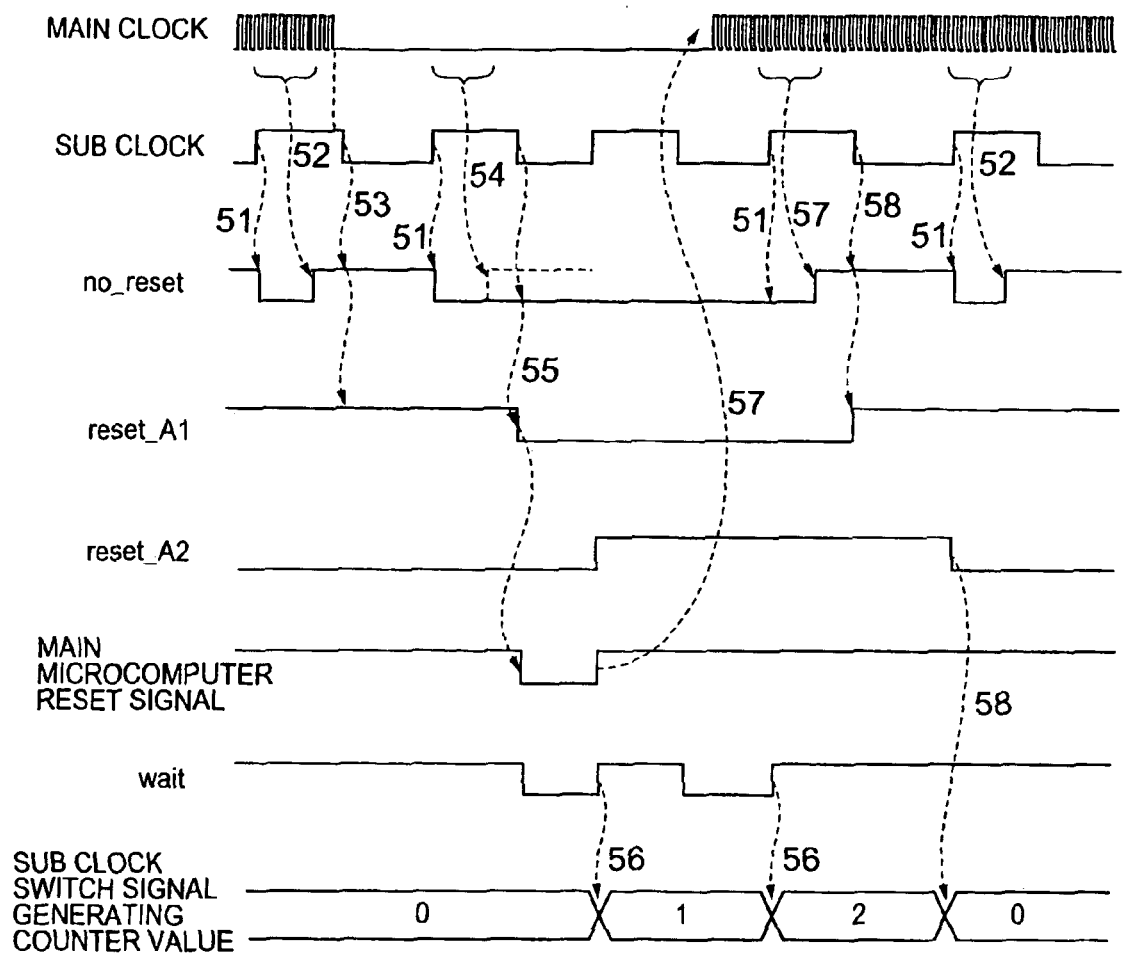
FIG. 5 is a timing chart showing a waveform of operation in the case in which the main clock is stopped when the main clock normal operation confirming flag is 1 and thereafter recovered.
Figure 8:
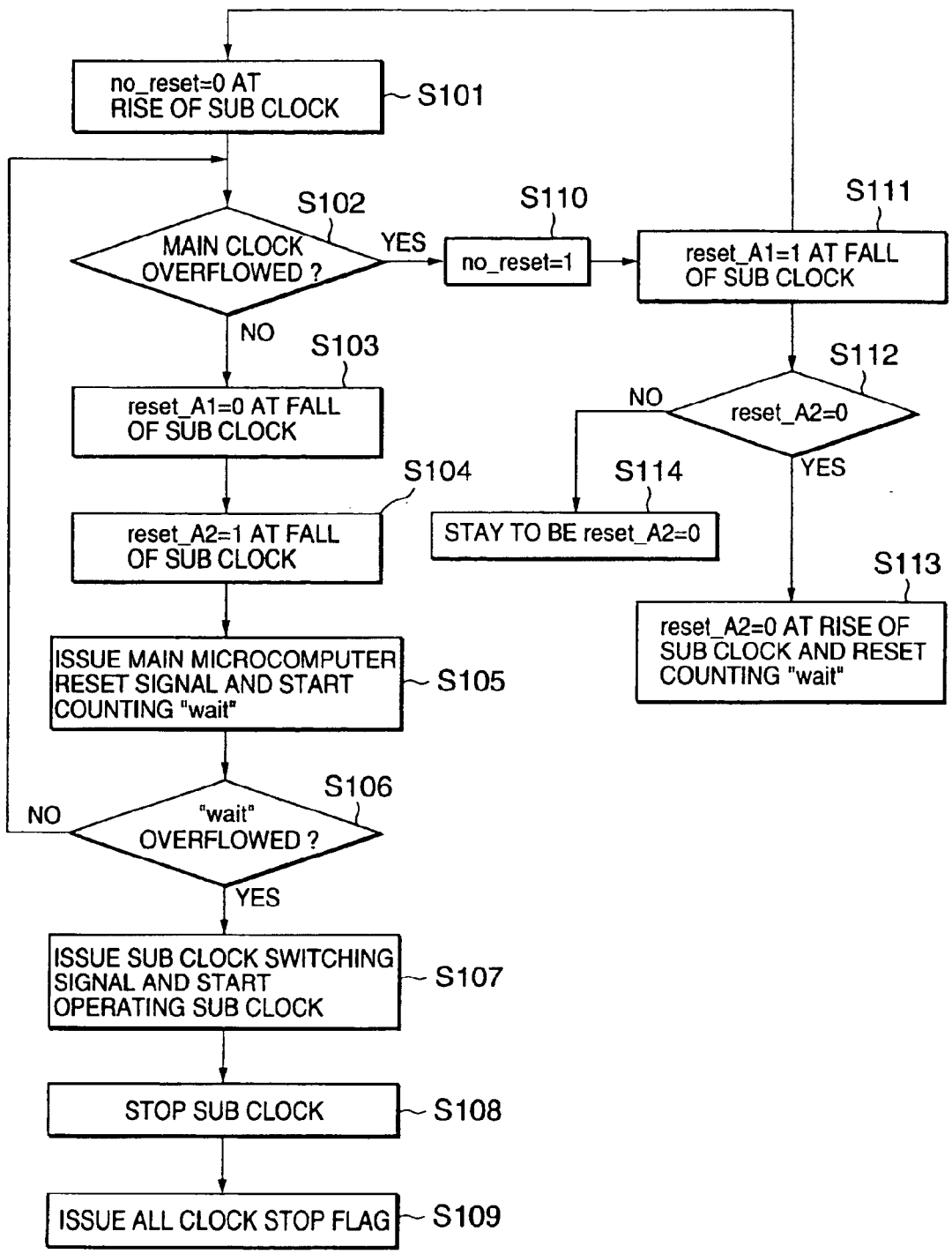
FIG. 8 is a flowchart for explaining operation of the clock monitoring apparatus according to the invention.

When the main clock is equal to the set value of the counter or overflowed (Yes at step S102 of FIG. 8), no_reset=1 (notation 52 in FIG. 4, step S110 of FIG. 8).

At fall of the sub clock, no_reset=1 (step S111 of FIG. 8) and therefore, the reset_A1 stays to be "H" and the main microcomputer reset signal is not issued (notation 53 in FIG. 4).

Figure 7:
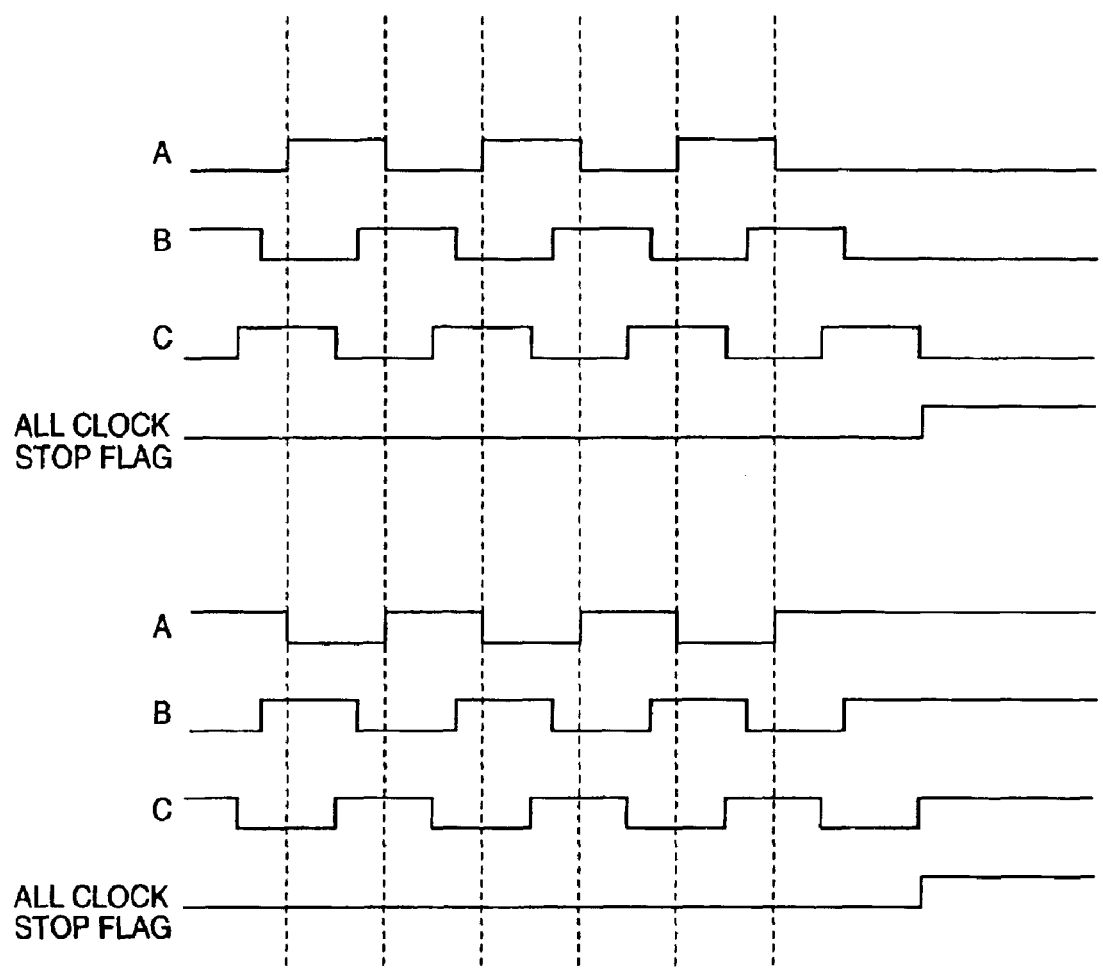
FIG. 7 is a timing chart showing a waveform of operation when an all clock stop flag is produced.

Next, an explanation will be given of a case in which the main clock is stopped, the main microcomputer is initialized, as a result, the main clock is recovered. When the main clock is stopped, the counter is not overflowed or does not reach the predetermined set value (No at step S102 of FIG. 8). Therefore, the flag no_reset stays to be "L" and the reset_A1 stays to be "H" (step S103 of FIG. 8). Further, even when a time period of stopping the main clock is a time period of "H" of no_reset or a time period of "L" thereof, the main clock is operated without problem. As shown by FIG. 7, when the main clock is stopped during a time period from rise of no_reset to fall of the sub clock thereafter, the main microcomputer reset signal is generated at fall of the sub clock one period thereafter (notation 54 in FIG. 4).

In the case in which no_reset=0 at fall of the sub clock, reset_A1=0. There is generated the flag reset_A2 constituted by inverting the reset_A1 and delaying by a half period of the sub clock. Therefore, in this case, at rise of the sub clock, reset_A2=1 (step S104 of FIG. 8). There is issued the main microcomputer reset signal generated by calculating a logical sum of reset_A1 and reset_A2 to the main microcomputer and the main microcomputer is initialized (notation 55 in FIG. 4, step S105 of FIG. 8).

At this occasion, counting of a signal "wait" constituted by calculating a logical sum of reset_A1 and the sub clock is started by the sub clock switch signal generating counter (notation 56 in FIG. 4, step S107 of FIG. 8), the sub clock switching signal is issued and the sub clock is operated (step S107 of FIG. 8). That is, the sub clock switching control portion 202 starts counting the sub clock at a time point of generating the main clock stop flag, issues the sub clock switching signal when the counter is overflowed or reaches the set value and is switched to sub clock operation. When the main clock is recovered and the main clock stop flag is reset by the main clock monitoring portion, the counter is reset and the operation returns to a standby state.

When the main clock is recovered before the sub clock switch signal generating counter is overflowed, the counter in the main clock monitoring circuit 401 is overflowed again and no_reset=1 (notation 57 in FIG. 4, step S110 of FIG. 8).

In the case of no_reset=1 at fall of the sub clock, reset_A1=1, reset_A2 becomes "L" at rise of the sub clock. The sub clock switch signal generating counter is reset at fall of reset_A2 and therefore, the operation is not switched to the sub clock (notation 58 in FIG. 4).

Figure 6:
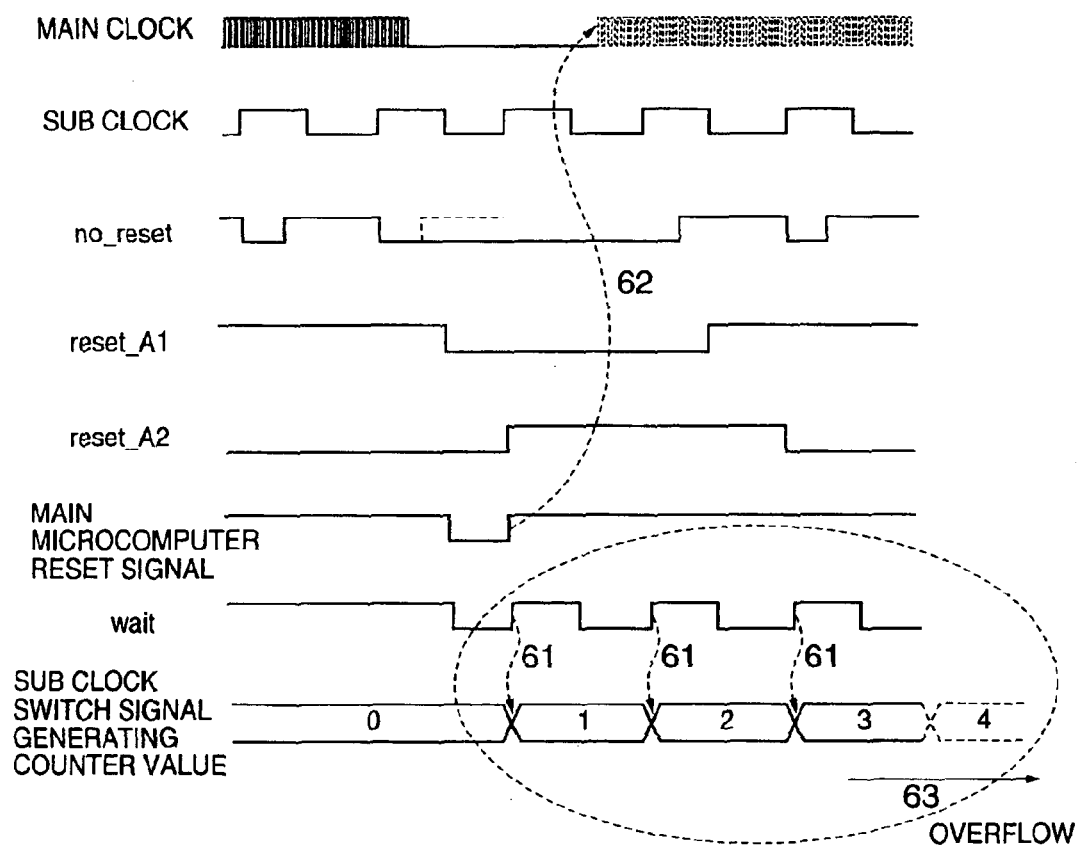
FIG. 6 is a timing chart showing a waveform of operation in the case in which the main clock is stopped and switched to a sub clock.

Next, an explanation will be given of a case in which even when the main clock is stopped and the main microcomputer is initialized, the main clock stays to be stopped in reference to FIG. 6. After initializing the main microcomputer by the above-described procedure, there is counted an output of a signal "wait" constituted by calculating the logical sum of reset_A1 and the sub clock by the sub clock switch signal generating counter (notation 61 in FIG. 4).

When the main clock is not recovered (notation 62 in FIG. 4), the sub clock switch signal generating counter is overflowed and the sub clock switching signal is issued (notation 63 in FIG. 4).

Further, an explanation will be given of a case in which after switching the operation clock to the sub clock, the sub clock is stopped in reference to FIG. 3 and FIG. 7. The sub clock self monitoring portion 203 is provided with the delay adding circuit 405 issuing a signal B constituted by delaying the sub clock by ⅜ period and the delay adding circuit 406 issuing a signal C produced by delaying the signal B by ⅜ period, functions when the main clock stop flag is generated and issues a flag indicating that all the clocks are stopped when the sub clock is stopped. By the function, it is possible that when the main clock is stopped, the main clock is automatically initialized and when the main clock is recovered thereby, the continuing operation is carried out under a state before abnormality. Further, it is possible that when the main clock cannot be recovered, the continuing operation is carried out by switching the main clock to the sub clock and when the sub clock is also stopped, the flag is issued. That is, the sub clock is provided with a function of monitoring the sub clock per se.

A specific explanation will be given of operation of the sub clock self monitoring portion 203 as follows. Notation "A" in FIG. 3 designates the sub clock, notation "B" designates the clock produced by delaying the sub clock by ⅜ period and notation "C" designates the clock produced by delaying "B" by ⅜ period.

When the main clock is stopped (step S108 of FIG. 8), reset_A2 in FIG. 3 is "H" and therefore, AND of reset_A2 and an inverted signal of a signal produced by calculating exclusive-OR of A, B, and C, constitutes all clock stop flag. When the sub clock is stopped, after ¾ period, the all clock stop flag is issued (step S109 of FIG. 8). The flag can be issued even when the sub clock is stopped in the state of "H" or the state of "L". Further, the delay of ⅜ period is added in generating "B" and "C" because it is determined that the phase relationship is mostly pertinent for preventing occurrence of spike and even when the value of delay is changed, the change naturally falls in the range of the invention.

Figure 9:
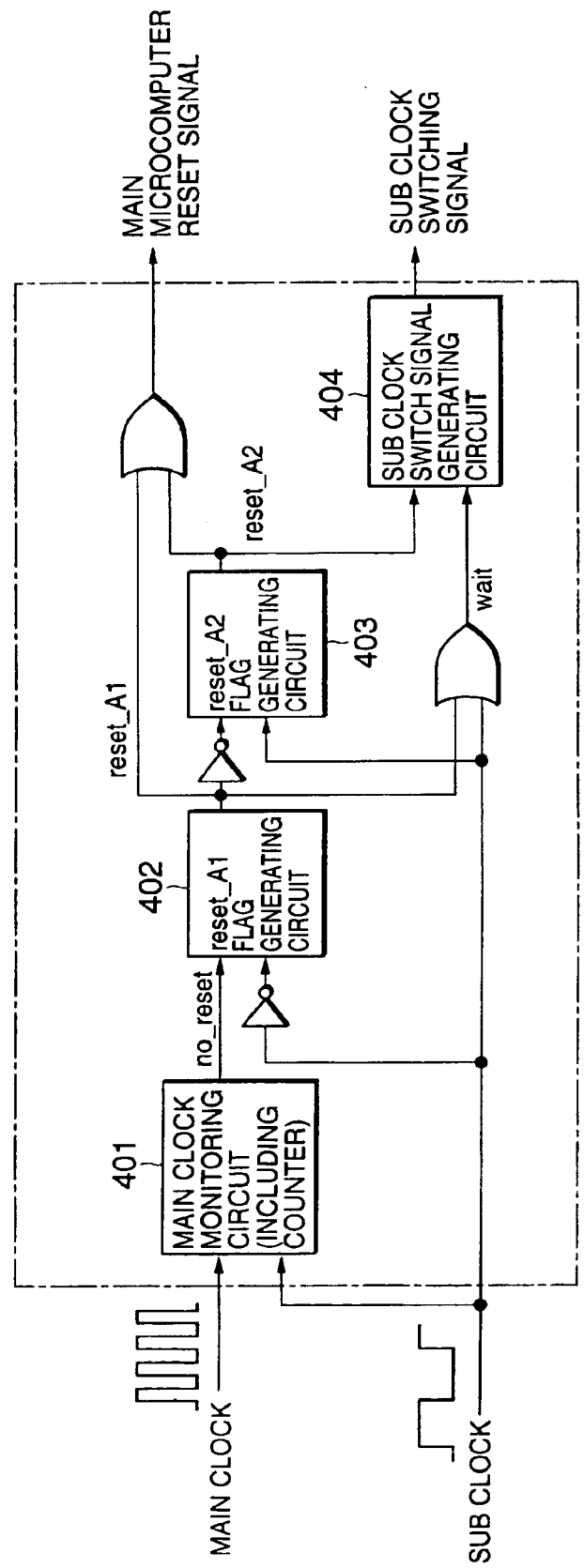
FIG. 9 is block diagram showing a second embodiment of a clock monitoring apparatus according to the invention.

An explanation will be given of a second embodiment of a clock monitoring apparatus according to the invention as follows. According to the embodiment, as shown by FIG. 9, the sub clock self monitoring portion is deleted in the above-described first embodiment. Although the all clock stop flag cannot be issued thereby, since the delay adding circuits and the exclusive-OR circuit are dispensed with, the circuit scale can be reduced.

Figure 10:
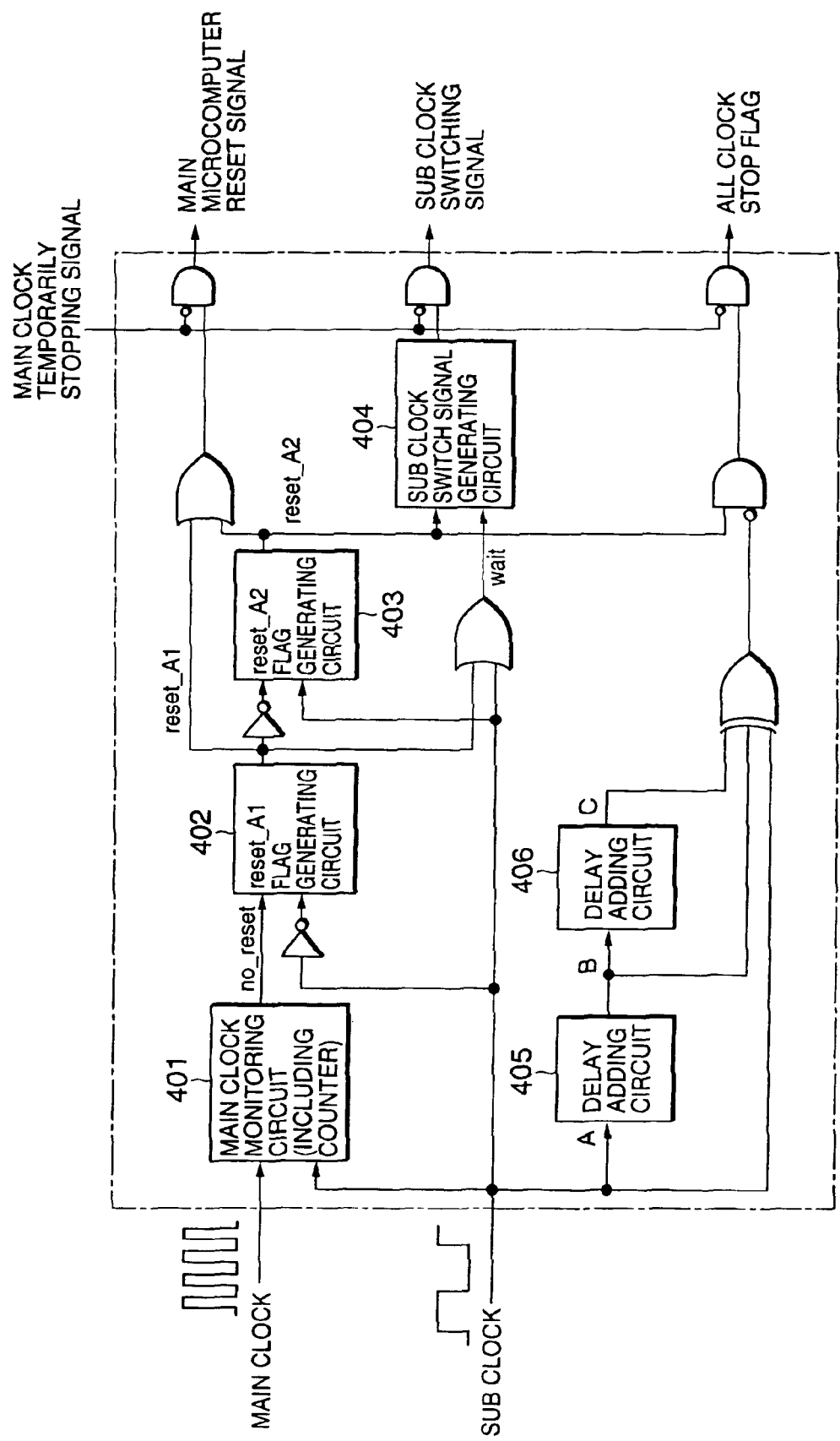
FIG. 10 is a block diagram showing a third embodiment of a clock monitoring apparatus according to the invention.

An explanation will be given of a third embodiment of a clock monitoring apparatus according to the invention as follows. According to the embodiment, as shown by FIG. 10, there is added a main clock temporarily stopping signal for controlling to issue the main microcomputer reset signal, the sub clock switching signal and the all clock stop flag of the above-described first embodiment. Thereby, even when the user intentionally stops the main clock by a signal of temporarily stopping the main clock such as HALT, the respective output signals are not issued.

Figure 11:
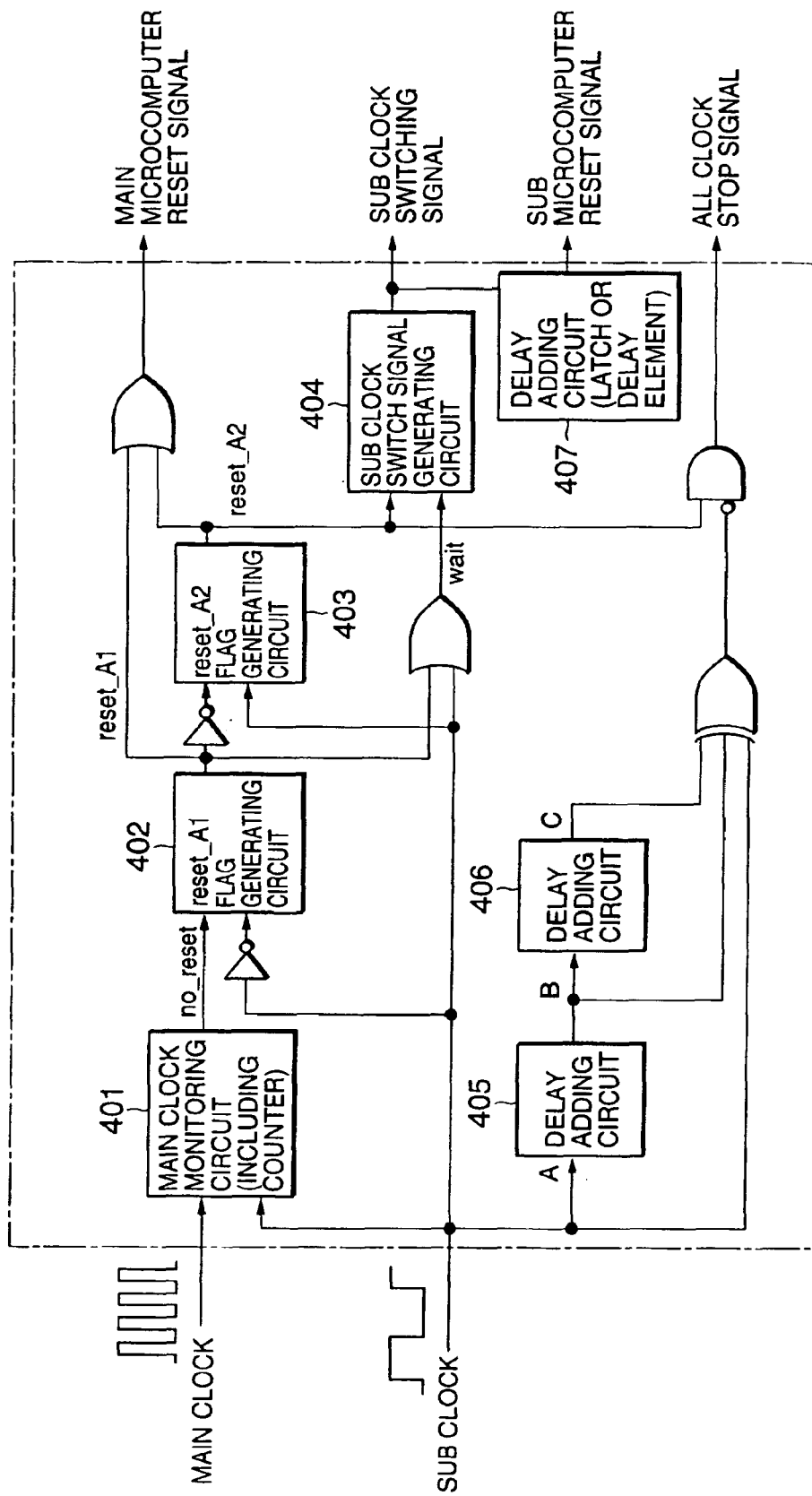
FIG. 11 is a block diagram showing a fourth embodiment of a clock monitoring apparatus according to the invention.
Figure 12:
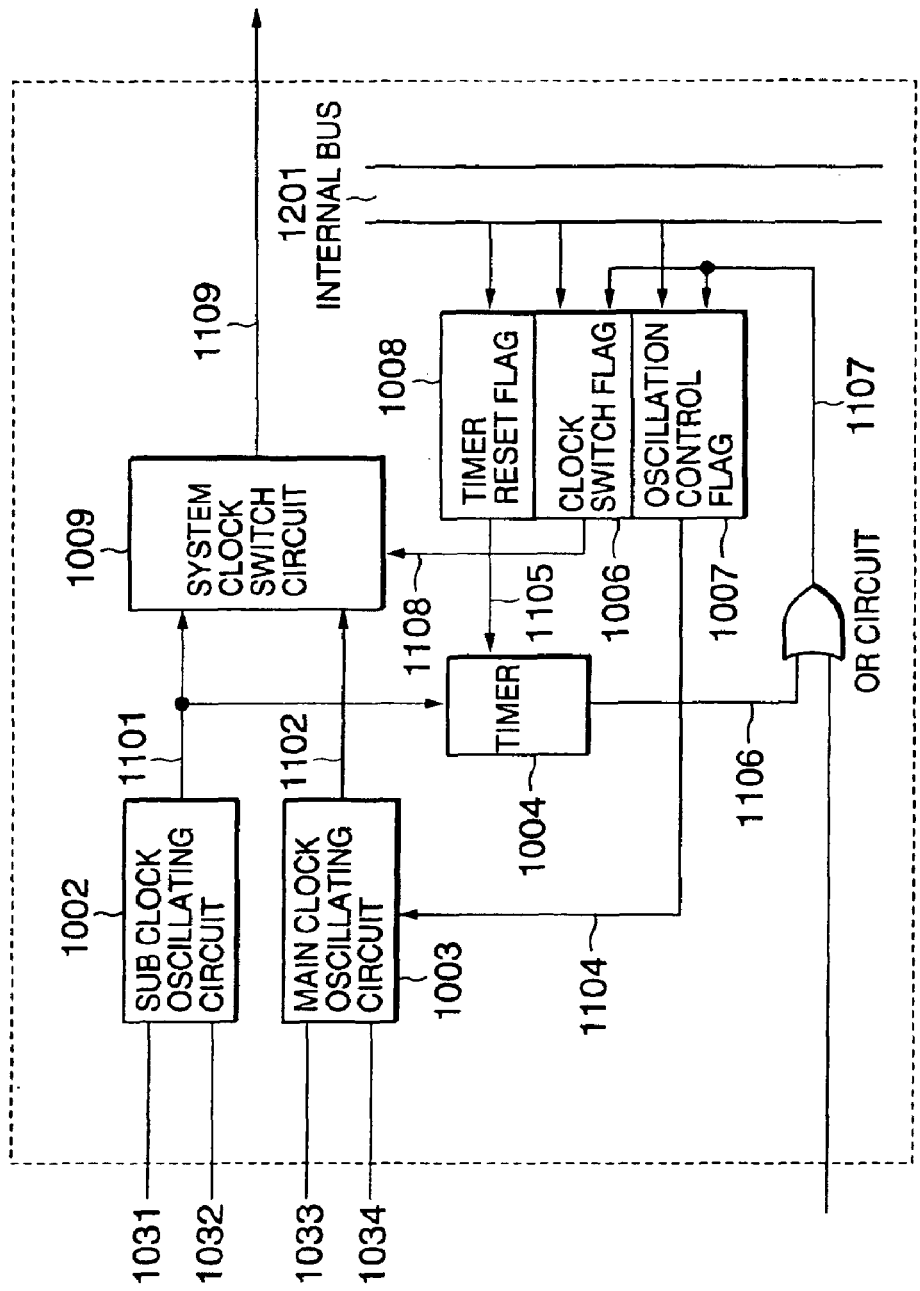
FIG. 12 is a block diagram showing an example of a clock monitoring apparatus of a prior art.

An explanation will be given of a fourth embodiment of a clock monitoring apparatus according to the invention as follows. According to the embodiment, as shown by FIG. 11, the sub clock switching control portion of the above-described first embodiment is provided with a sub microcomputer reset signal generating function. Thereby, after switching to a sub clock operation mode, the sub microcomputer per se can be initialized by a sub microcomputer reset signal generated via a delay circuit.

In this way, the invention realizes that when the main clock is stopped, the main clock is initialized and when the main clock is recovered thereby, the continuing operation is carried out under the state before abnormality. Further, when the main clock is not recovered, the continuing operation can be carried out by switching the main clock to the sub clock. Further, when the sub clock is also stopped, the all clock stop flag can be issued, further, a series of operation can be carried out without control of a software or the like.

Further, although the normally counting signal for monitoring the operational state of the main clock has been the sub clock in the example of the related art, according to the invention, the signal is constituted by the high-speed main clock and therefore, a time period until the counter is overflowed or reaches the set value, is shortened and in comparison with the example of the related art, there is also achieved an effect of capable of significantly shortening a time period until dealing with the stop of the main clock.

Further, in the above-described embodiments, various modifications can be carried out such as replacing the main microcomputer to a main clock generating apparatus, replacing the sub microcomputer to a system including the circuit of the invention, further, using the main microcomputer initializing signal, the sub clock switching signal and the all clock stop flag by themselves, or using these by various combinations.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A method for monitoring a main-clock generated by a main-microcomputer and a sub-clock, said sub-clock including a smaller number of clock pulses than those of said main-clock, said method comprising:

initializing said main-microcomputer at a time point during a specific period of time beginning when it is detected that said main-microcomputer has stopped supply of said main-clock; and when it is confirmed that said main-microcomputer has not resumed supply of said main-clock during said specific period of time, outputting a switch signal to allow switching from said main-clock to said sub-clock.

2. The method according to claim 1, wherein said initializing comprises issuing an initializing signal synchronized with a clock pulse of said sub-clock, said clock pulse of said sub-clock occurring immediately after said detection that said main-microcomputer has stopped supply of said main-clock.

3. The method according to claim 1, wherein said specific period of time is determined by beginning to count a predetermined number of clock pulses of said sub-clock after an initializing signal is issued.

4. The method according to claim 1, further comprising:
after outputting said switch signal, when it is detected that said sub-clock is not supplied any more, issuing a flag signal indicative that both said main-clock and sub-clock are not supplied any more.

5. The method according to claim 1, wherein, when it is confirmed that said main-microcomputer has resumed supply of said main-clock during said specific period of time, determining that said main-microcomputer has been restored to normal operations.

6. The method according to claim 5, further comprising issuing a second flag signal indicating said main-microcomputer is in normal operation.

7. The method according to claim 1, wherein, when it is confirmed that said main-microcomputer has resumed supply of said main-clock during said specific period of time, determining that outputting a switch signal to switch from said main-clock to said sub-clock is not necessary.

8. The method according to claim 1, wherein said initializing comprises issuing an initializing signal synchronized with a clock pulse of said sub-clock.

9. The method according to claim 8, wherein said clock pulse of said sub-clock occurs immediately after said detection that said main-microcomputer has stopped supply of said main-clock.

10. A clock monitoring method, comprising:
  (a) counting clock pulses of a main-clock generated by a main-microcomputer to determine a first clock count indicative of how many clock pulses of said main-clock have been counted during a predetermined period of time;
  (b) when said first clock count has reached a first threshold, determining said main-microcomputer is in normal operation;
  (c) when said first clock count has not reached said first threshold, upon completion of said determination of said first clock count, resetting said main-clock by issuing a reset signal synchronized with a clock pulse of a sub-clock and immediately occurring after said completion of said determination of said first clock count, said sub-clock containing a smaller number of clock pulses than those of said main-clock, and simultaneously, counting clock pulses of said sub-clock after said completion of said determination of said first clock count to determine a second clock count indicative of how many clock pulses of said sub-clock have been counted after resetting said main-clock;
  (d) when said first clock count has not reached said first threshold and said main-microcomputer is restored before said second clock count reaches a second threshold, determining said main-microcomputer has been restored to normal operations; and
  (e) when said first clock count has not reached said first threshold and said main-microcomputer is not restored before said second clock count reaches said second threshold, outputting a switch signal to allow switching from said main-clock to said sub-clock.

11. The method according to claim 10, further comprising after the step (e), when said sub-clock is not supplied any more, issuing a first flag signal indicative that both said main-clock and sub-clock are not supplied any more.

12. The method according to claim 10, wherein the step (b) further comprises:
  issuing a second flag signal indicating said main-microcomputer is in normal operation.

13. The clock monitoring method according to claim 12, wherein the step (c) further comprises:
  issuing a third flag signal having outputs corresponding to high and low levels of said second flag signal.

14. The method according to claim 13, wherein said second count is determined by counting clock pulses of an output signal beginning when said reset signal is issued, said output signal being created by calculating a logical sum of said sub-clock and said third flag signal.

15. The method according to claim 13, wherein the step (b) further comprises:
  setting said second clock count to be zero using a fourth flag signal created by delaying said third flag signal by a predetermined period to produce a new flag signal and then inverting said new flag signal.

16. The method according to claim 15, wherein said first flag signal is created so that said sub-clock is delayed a predetermined period to produce a first delay signal, said first delay signal is delayed a predetermined period to produce a second delay signal, an exclusive—OR of said sub-clock and said first and second delay signals is calculated, and said first flag signal is determined by computing a logical product of said exclusive—OR and said fourth flag signal.

17. A method of changing a clock signal from a main-clock supplied by a data processor to a sub-clock, comprising:
  monitoring said main-clock to detect that said main-clock has stopped;
  initializing said data processor to attempt to restore said main-clock; and
  allowing said sub-clock to be supplied instead of said main-clock when said main-clock is not restored during a specific period of time.

18. The method according to claim 17, wherein said specific period of time is determined by beginning to count a predetermined number of clock pulses of said sub-clock after an initializing signal is issued.

19. A method for monitoring a main-clock generated by a main-microcomputer and a sub-clock, said method comprising:
  detecting whether said main-microcomputer has stopped supply of said main-clock;
  initializing said main-microcomputer at a time point during a specific period of time beginning when said detecting detects that said main-microcomputer has stopped supply of said main-clock;
  confirming whether said main-microcomputer has resumed supply of said main-clock during said specific period of time; and
  outputting a switch signal to switch from said main-clock to said sub-clock when said confirming confirms that said main-microcomputer has not resumed supply of said main-clock during said specific period of time,
  wherein a number of clock pulses of said sub-clock is less than a number of clock pulses of said main-clock.

20. The method according to claim 19, wherein said specific period of time is determined by beginning to count a predetermined number of clock pulses of said sub-clock after an initializing signal is issued.

* * * * *